United States Patent [19]

Bitting

[11] Patent Number: 5,302,920

[45] Date of Patent: Apr. 12, 1994

[54] CONTROLLABLE MULTI-PHASE RING OSCILLATORS WITH VARIABLE CURRENT SOURCES AND CAPACITANCES

[75] Inventor: Ricky F. Bitting, Fort Collins, Colo.

[73] Assignee: NCR Corporation, Dayton, Ohio

[21] Appl. No.: 959,868

[22] Filed: Oct. 13, 1992

[51] Int. Cl.$^5$ .................. H03B 5/24; H03K 3/354
[52] U.S. Cl. ........................... 331/45; 331/48; 331/49; 331/57; 331/108 A; 331/108 B; 331/177 R; 331/179; 307/602; 307/603; 307/605
[58] Field of Search ............... 331/34, 36 C, 46, 48, 331/49, 57, 108 A, 108 B, 135, 177 R, 179, 45; 307/597, 603, 606, 602, 605

[56] References Cited

U.S. PATENT DOCUMENTS

| | | | |
|---|---|---|---|
| 3,931,588 | 1/1976 | Gehweiler | 331/57 |
| 4,052,673 | 10/1977 | Herzog | 331/57 X |
| 4,091,335 | 5/1978 | Giolma et al. | 331/1 A |
| 4,625,181 | 11/1986 | Bichler | 331/57 |
| 4,626,798 | 12/1986 | Fried | 331/1 A |
| 4,656,369 | 4/1987 | Lou | 307/297 |
| 4,694,261 | 9/1987 | Ewen et al. | 331/57 |
| 4,695,808 | 9/1987 | Cabaniss et al. | 331/57 |
| 4,771,251 | 9/1988 | Allen et al. | 331/57 |
| 4,879,530 | 11/1989 | Wilhelm et al. | 331/45 |
| 4,978,927 | 12/1990 | Hausman et al. | 331/57 |
| 5,012,142 | 4/1991 | Sonntag | 307/602 |
| 5,028,888 | 7/1991 | Ray | 331/57 |
| 5,036,216 | 7/1991 | Hohmann et al. | 331/57 X |
| 5,038,118 | 8/1991 | Langenkamp | 331/57 |
| 5,136,260 | 8/1992 | Yousefi-Elezei | 331/57 X |
| 5,208,557 | 5/1993 | Kersh, III | 331/57 |

*Primary Examiner*—Siegfried H. Grimm
*Attorney, Agent, or Firm*—James H. Beusse

[57] ABSTRACT

An electrically controlled oscillator circuit having multi-phase outputs with programmable frequency. The circuit includes a ring oscillator having a plurality of inverting stages. Each stage has an output which is connected to a switch that can be programmed to select one of a plurality of capacitors with different values to change the frequency range of the oscillator. Controlled current is fed to the stages to vary the frequency of the oscillator within a selected frequency range. Using capacitors to change the frequency range of the oscillator reduces variations of the oscillator output frequency.

13 Claims, 8 Drawing Sheets

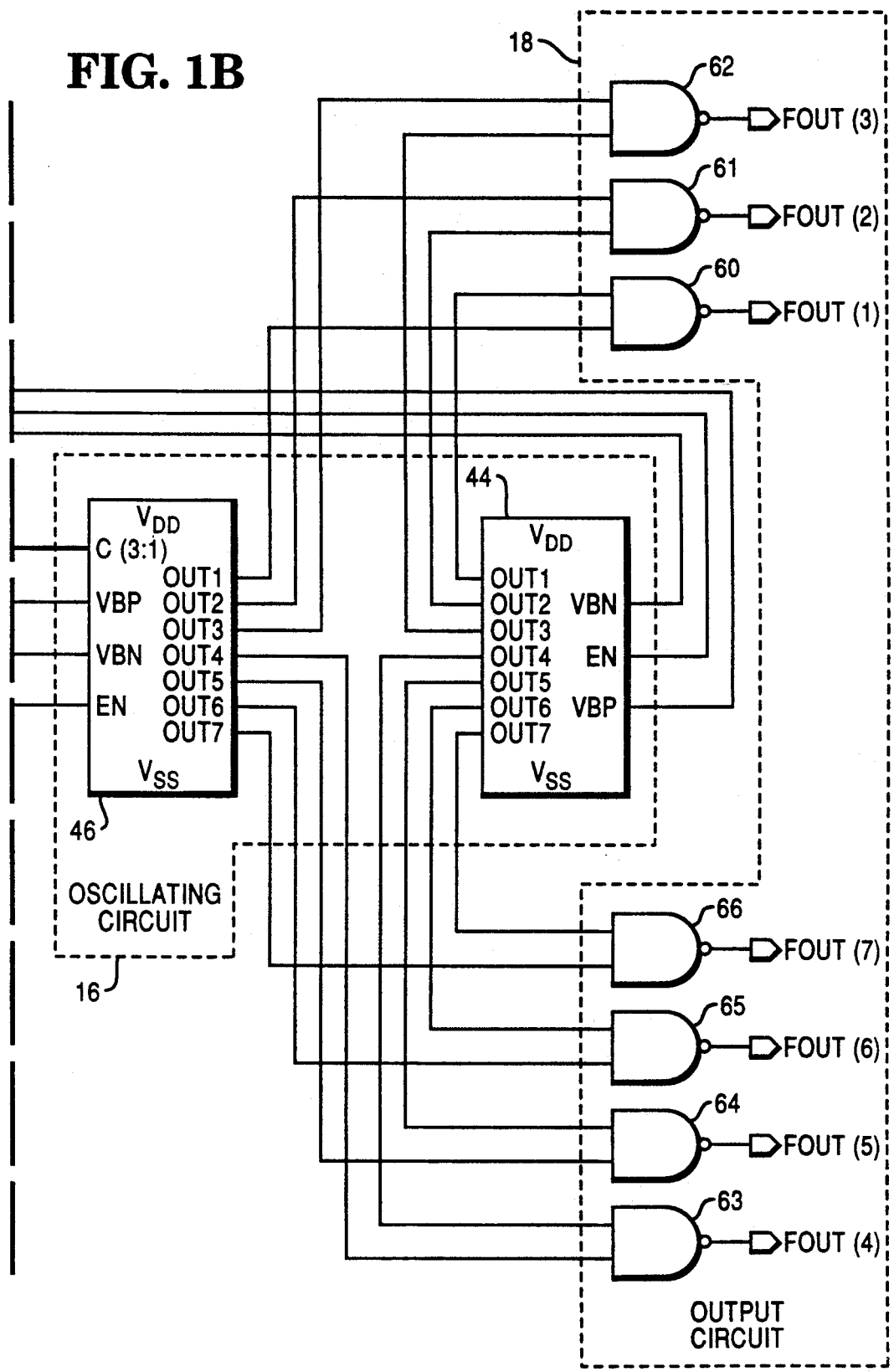

CONTROLLABLE MULTI-PHASE RING OSCILLATORS WITH VARIABLE CURRENT SOURCES AND CAPACITANCES

BACKGROUND OF THE INVENTION

This invention relates to electrically controlled oscillating circuits and more particularly to current or voltage controlled ring oscillators with programmable output frequencies.

Current controlled oscillators (ICO) or voltage controlled oscillators (VCO) are frequently used with phase-locked loop circuits. Typical applications for a phase-locked loop circuit include frequency synthesis or clock generation. When VCOs and ICOs are used in high frequency operations (greater than 100 Mhz), with multi-phased outputs, the oscillator of choice is a ring oscillator.

Ring oscillators have a chain of inverters connected together. The output of one of the inverters is connected in series to the input of another inverter. The output of the last inverter in the chain is connected to the input of the first inverter. Each of the inverters' outputs are tapped to provide signals with a common frequency and different phases. The output frequency is changed by varying the current supply to the oscillator.

The center frequency from oscillator to oscillator typically varies on the order of from 1.5:1 to 2:1 for a given current supply due to inherent process, temperature, and supply voltage variations of the oscillator. Often it is desired to generate output signals over several octave frequency ranges (e.g. 30–125 Mhz) with a ring oscillator while maintaining the range of the current required to change variations in the oscillator as small as possible. A wide output frequency range usually requires that multiple overlapping frequency ranges be used. The restriction on the control current swings is imposed by the voltage swing limitation of a charge pump which supplies current to the oscillator.

Other prior art circuits have used oscillators with programmable numbers of inverters or a single timing stage with programmable timing capacitors. It is not believed that either of these technologies can be used with systems requiring a fixed number of multi-phase outputs with well controlled relative phase shifts over a wide output frequency range.

SUMMARY OF THE INVENTION

An object of this invention is to provide an improved electrically controlled oscillator circuit.

Another object of this invention is to construct a ring oscillator having multi-phased outputs with repeatability of manufacturing of the oscillators.

It is a further object of this invention to construct a ring oscillator having an output frequency which is controlled by a current or voltage source where the variations in the output frequency as a function of current or voltage is within a predetermined tolerance.

It is also an object of this invention to generate a plurality of output signals having the same frequency with different phases wherein the range of the frequency of the output signals may be digitally programmable.

It is an additional object of this invention to supply a wide output frequency range with a ring oscillator that does not require multiple overlapping frequency ranges.

A further object of this invention is to generate a plurality of multiphase output signals having the same programmable frequency with well controlled relative phase shifts over a wide output frequency range.

These and other objects are provided with an electrically controlled oscillating circuit. The oscillating circuit has a ring oscillator with a plurality of stages where each stage has an input, an output, a predetermined delay and an output frequency. A plurality of capacitors having electrically programmable capacitance values are respectively electrically connected to the output of a corresponding one of the various stages. Thus, when the programmable value of one of the plurality of capacitors is changed, the delay between the stages and the output frequency of the stage varies accordingly.

In another aspect of the invention an electrically programmable oscillator circuit is provided having a ring oscillator with a plurality of inverters. Each inverter is operative to provide an output frequency on an output terminal. The output terminals are respectively connected in series to an input terminal of an adjacent inverter. The device provides a variable bias current to the plurality of inverters such that the output frequency of each inverter varies within a predetermined range as a function of the variation in bias current. A plurality of different frequency programming signals are provided. A plurality of programmable capacitor stages are respectively connected to the output terminal of the inverters. These capacitor stages are responsive to the different frequency programming signals by changing the predetermined range in which the output frequency of each inverter varies.

BRIEF DESCRIPTION OF THE DRAWINGS

FIGS. 1A and 1B together are a simplified block diagram of the electrically controlled oscillating circuit in accordance with one form of the invention;

DESCRIPTION OF THE PREFERRED EMBODIMENTS

Figure 1A:
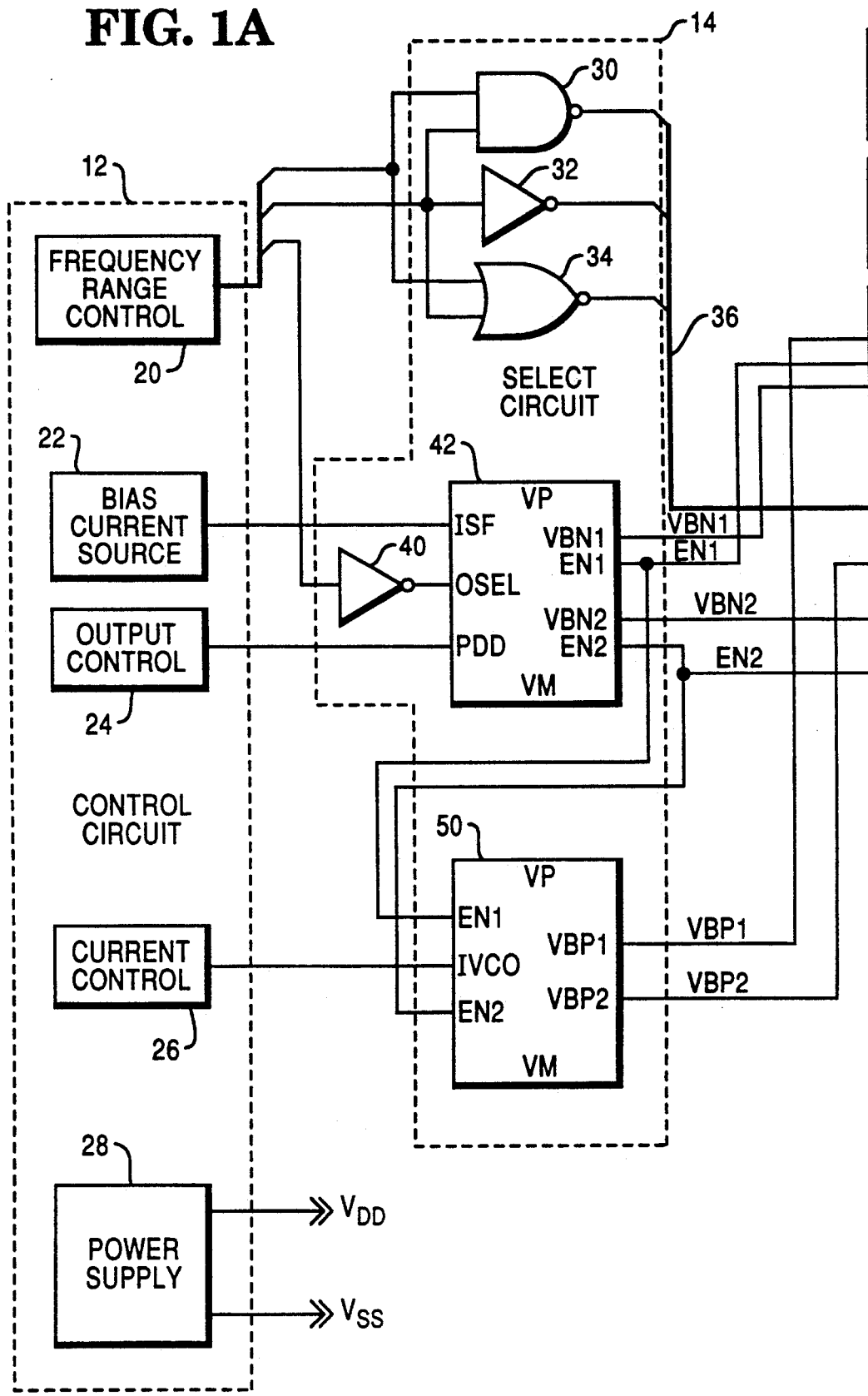

Referring to FIGS. 1A and 1B there is shown an electrically programmable oscillating circuit 10 having a control circuit 12 connected through select circuit 14 to oscillating circuit 16. Oscillating circuit 16 feeds a plurality of signals with the same frequency but with different phases to output circuit 18.

Control circuit 12 includes a frequency range controller 20, a bias current source (ISF) 22, an output controller 24, a current controller 26 and a power supply 28. Frequency range controller 20 includes preferably a microprocessor (not shown) that provides a multibit digital signal through select circuit 14 to select a range of frequencies to be generated by oscillating circuit 16. The bias current ISF is a constant current supplied to select circuit 14 for biasing purposes.

Current controller 26 is typically part of a phase-locked loop control circuit. Current controller 26 feeds a signal (IVCO) having variable current level (proportional to frequency) to select circuit 14. The output controller 24 is typically part of the frequency range controller 20, and enables the outputs of oscillating circuit 16.

Power supply 28 typically supplies a voltage level sufficient to power a field effect transistor. The positive terminal of power supply 28 is designated by VDD and the negative or ground terminal is designated by VSS.

Select circuit 14 includes NAND gate 30, inverter 32 and NOR gate 34 which convert selected bits of the multi-bit signal from frequency range controller 20 to a digital select bit on line 36. The digital select bit is fed to oscillating circuit 16 to select the desired frequency range of oscillating circuit 16. More details of these frequency ranges will be discussed later.

Frequency controller 20 feeds another selected bit (OSEL) through inverter 40 to current/voltage bias selector 42. OSEL enables low frequency ring oscillator 46 in oscillating circuit 16 when set to a low state, and enables high frequency range ring oscillator 44 within oscillating circuit 16 when set to a high state.

A current/voltage bias selector 42 and voltage bias generator 50 receive current on an input and provide voltage bias levels to oscillating circuit 16. Output controller 24 with frequency range controller 20 selectively enables either the low frequency ring oscillator 46 or high frequency ring oscillator 44 with signal PDD. Voltage bias selector 42 feeds a voltage bias signal for NMOS transistors (VBN1 and VBN2) to ring oscillators 44 and 46, respectively. Voltage bias generator 50 feeds a voltage bias signal for PMOS transistors (VBP1 and VBP2) to ring oscillators 44 and 46, respectively. Signals VBN1 and VBN2 fluctuate in accordance with the ISF signal from current control 22, while VBP1 and VBP2 signals generated by voltage bias generator 50 respond in accordance with the IVCO signal from current controller 26. The signals VBP2, VBN2 and EN2 are fed to ring oscillator 46 when ring oscillator 46 is enabled by OSEL from range controller 20. The signals VBP1, VBN1, and enable signal EN1) are fed to ring oscillator 44 when OSEL from frequency range controller 20 enables ring oscillator 44.

Oscillator circuit 16 includes low frequency seven stage ring oscillator 46 and high frequency seven stage ring oscillator 44 which supply a multi-phase output to various NAND gates 60–66 within output circuit 18. Low frequency ring oscillator 46 preferably has four ranges of output frequency which include the ranges 30–40 mHz, 40–55 mHz, 55–75 mHz, and 75–100 mHz. Although a seven stage ring oscillator having the aforementioned frequency variations is described, any odd number of stages and any frequency range may be selected. The aforementioned ranges are selected by the state of the selected or programming bits from frequency range controller 20. The output of high frequency ring oscillator 44 typically ranges from 100–125 mHz and is enabled with OSEL from frequency range controller 20. When ring oscillators 44 and 46 are enabled, they supply multi-phase output frequencies to output circuit 18. However, when oscillators 44 and 46 are disabled, they feed a high voltage level to output circuit 18.

Output circuit 18 includes a plurality of NAND gates 60–66 for generating multi-phase frequency outputs from the enabled ring oscillator 44 or 46. These outputs are referred to as FOUT(1)–FOUT(7). The output signals from oscillator 44 are NANDed with the output signals from oscillator 46 using gates 60–66.

Figure 2:
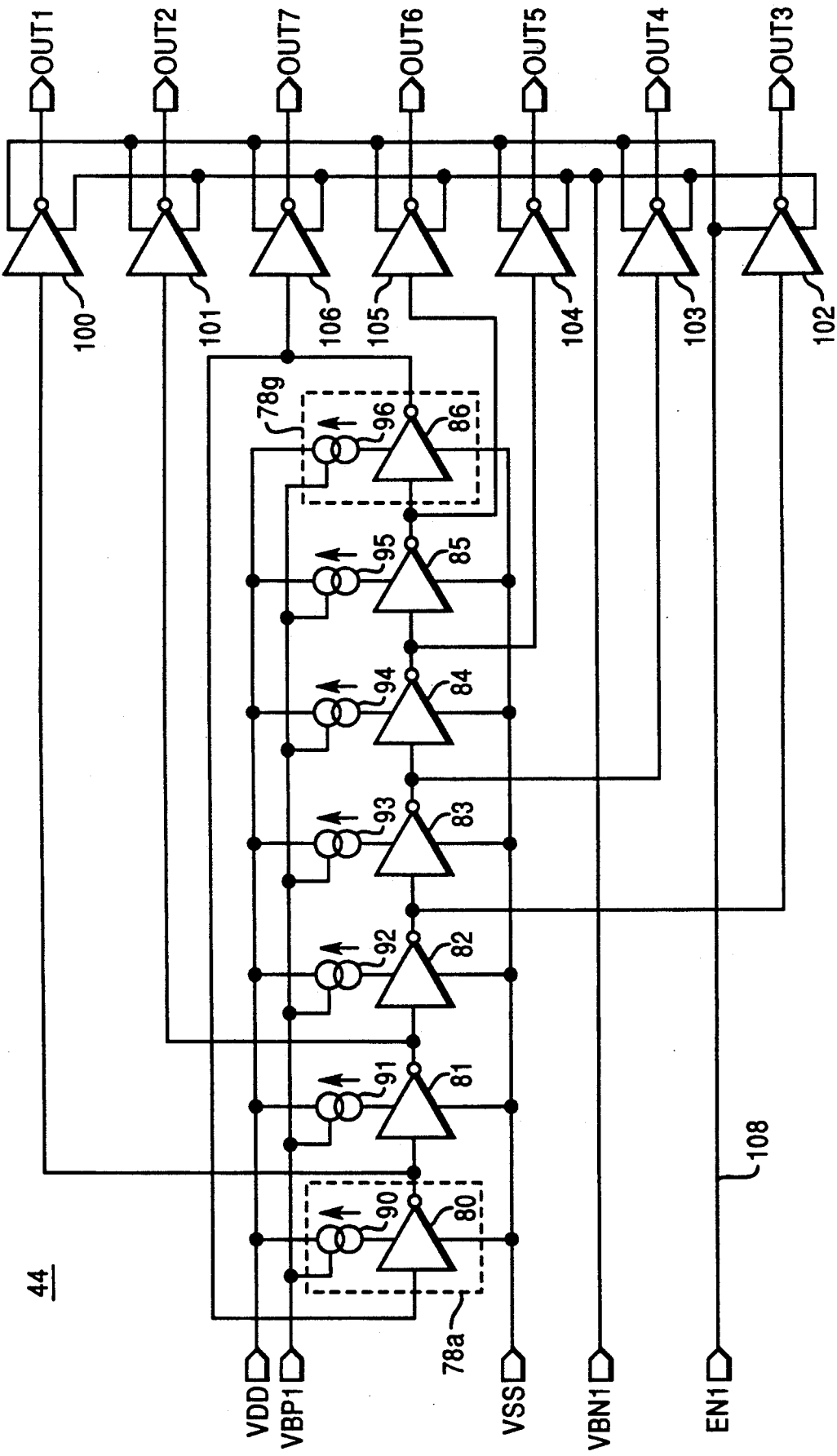
FIG. 2 is a schematic diagram of the seven stage ring oscillator shown in FIG. 1B for lower frequencies.

Referring to FIG. 2 there is shown a schematic representation of one form of the high frequency ring oscillator 44. Ring oscillator 44 includes a plurality of stages 78a–78g. Each of the stages 78a–78g respectively includes one of the inverters 80–86 coupled in circuit with a corresponding one of the bias current sources 90–96. In the preferred embodiment of the invention, bias current sources 90–96 are part of the inverters 80–86 (See FIG. 4). Inverters 80–86 each have an input terminal and an output terminal. The output terminal of each of the inverters is connected in series to an input terminal of a serially adjacent inverter. The first inverter 80 in the series has its input terminal connected to the output terminal of the last inverter 86 in the series.

Bias current sources 90–96 are connected to VDD and are controlled by the voltage level of signal VBP1, the positive bias voltage from voltage bias generator 50. Bias current sources 90–96 respond to the voltage on VBP1 by increasing or decreasing current to inverters 80–86 accordingly. Inverters 80–86 are connected to a common negative supply line VSS.

The signals on the output terminals of inverters 80–86 are fed to source follower buffers 100–106, respectively. The signal on each of the output terminals of buffers 100–106 have different phase angles. An enable line 108 is provided which feeds the EN1 signal to enable the output of the source follower buffers 100–106. The VBN1 signal fed to the source follower buffers 100–106 sets the input impedance of the source follower buffers to control the output frequency of inverters 80–86 by changing the RC time constant of each stage. The output signals from source follower buffers 100–106 are fed to output circuit 18 (see FIG. 1B).

Figure 3:
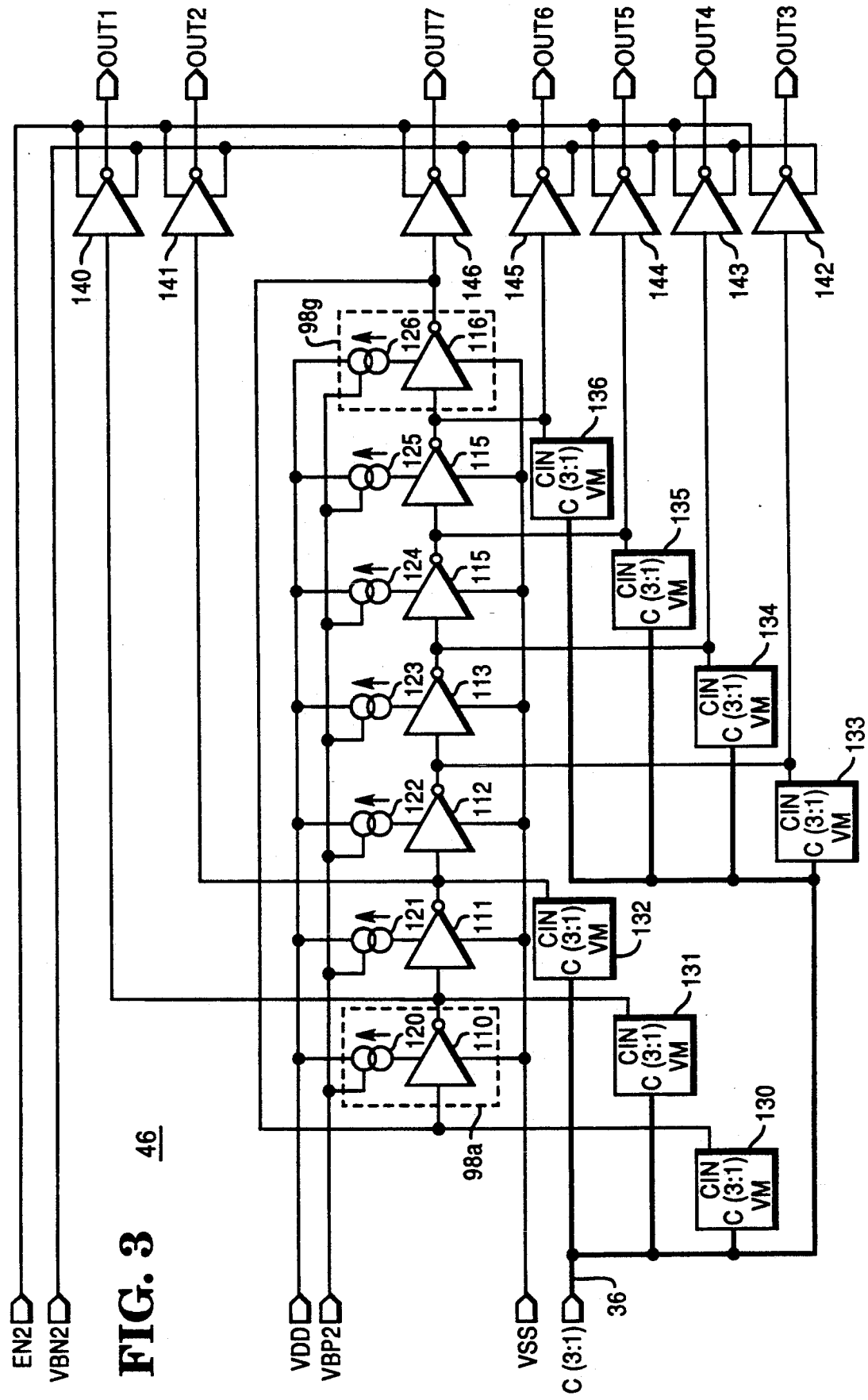
FIG. 3 is a schematic diagram of the seven stage ring oscillator shown in FIG. 1B for high frequencies.

Referring to FIG. 3, there is shown a detailed schematic diagram of low frequency ring oscillator 46. This ring oscillator includes a plurality of stages 98a–98g that respectively include inverters 110–116 connected to bias current sources 120–126. Inverters 110–116 have a negative power terminal connected to the VSS line and a positive power terminal connected respectively through current sources 120–126 to power supply line VDD. Bias current sources 120–126 have a control terminal connected to VBP2. The voltage level on VBP2 sets the amount of current which the current sources 120–126 feed to inverters 110–116.

Each of inverters 110–116 have an input and an output terminal connected in series, where the output terminal of each inverter is serially connected to the input terminal of an another inverter. The output terminal of the last stage inverter 116 is connected to the input terminal of the first stage inverter 110. The output terminals of these inverters 110–116 are respectively coupled to programmable capacitors 130–136 and to source follower buffers 140–146. Programmable capacitors 130–136 each have an adjustable capacitance value which is programmed from digital signals on lines 36. These digital signals change the value of programmable capacitors 130–136 which in turn change the delay across each stage and the output frequency ranges of inverters 110–116. A VBN2 signal is fed to each of the source follower buffers 140–146. The VBN2 signals change the input impedance of the source follower buffers 140-146 which also in turn varies the frequency output of inverters 110-116.

Signal EN2 is fed to source follower buffers 140-146. Signal EN2 enables the source follower buffers 140-146 to feed to their output terminals the signal fed to their respective input terminal. When signal EN2 is inactive, the source follower buffers provide a signal with a high voltage level output to output circuitry 18.

Figure 4:
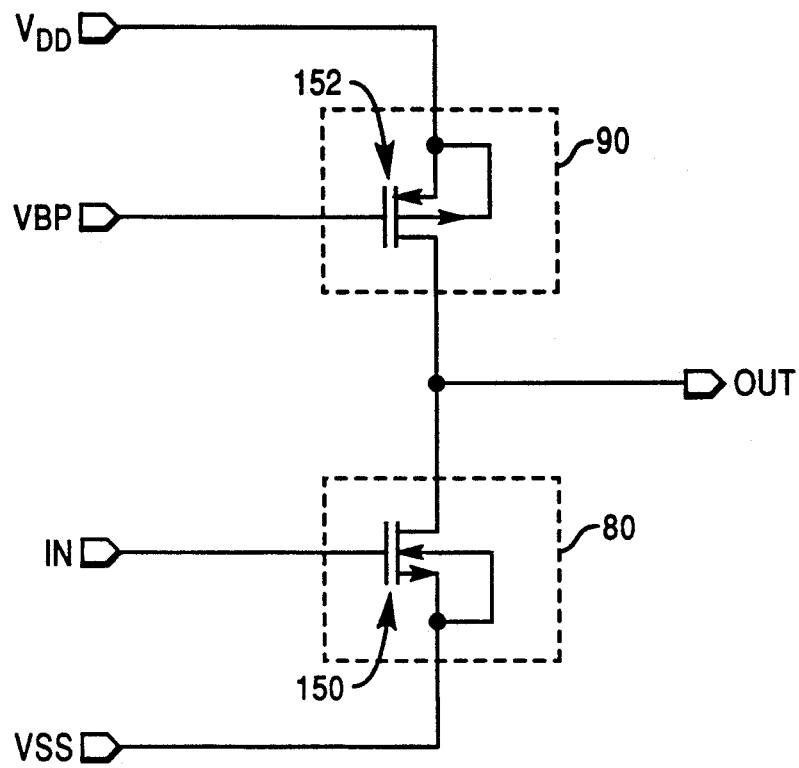
FIG. 4 is a detailed schematic diagram of the inverters shown in FIGS. 2 and 3.

Referring to FIG. 4, there is shown a detailed schematic diagram of one of stages 78a-78g and 98a-98g. The circuits within each of the stages 78a-78g and 98a-98g are identical. Thus, only one of the stages 78a will be described.

Stage 78a has an input terminal (IN), an output terminal (OUT), a positive power terminal (VDD), a negative power terminal (VSS), a bias terminal (VBP), and includes an inverter 80 and a current source 90. Inverter 80 is illustrated as a FET (preferably NMOS) transistor 150 having source, gate and drain terminals. The gate terminal of transistor 150 is connected to the input terminal (IN) while the drain terminal of transistor 150 is connected to the output terminal (OUT) and to current source 90. The source terminal of transistor 150 is connected to the VSS terminal.

Current source 90 is illustrated as a FET transistor 152 (preferably PMOS) with a source terminal connected to the VDD line, and a gate terminal coupled to terminal VBP. The drain terminal of transistor 152 is connected to the drain terminal of FET 150 of the current source 90. The signal at VBP, e.g., VBP1, sets the level of current at OUT. When the input terminal of transistor 150 is low or inactive, transistor 150 is disabled. Accordingly, the output of the inverter 80 will be high. When the signal on input terminal of inverter 80 is high or active, the transistor 150 is enabled thereby shorting the output (OUT) of stage 78a to VSS.

Figure 5:
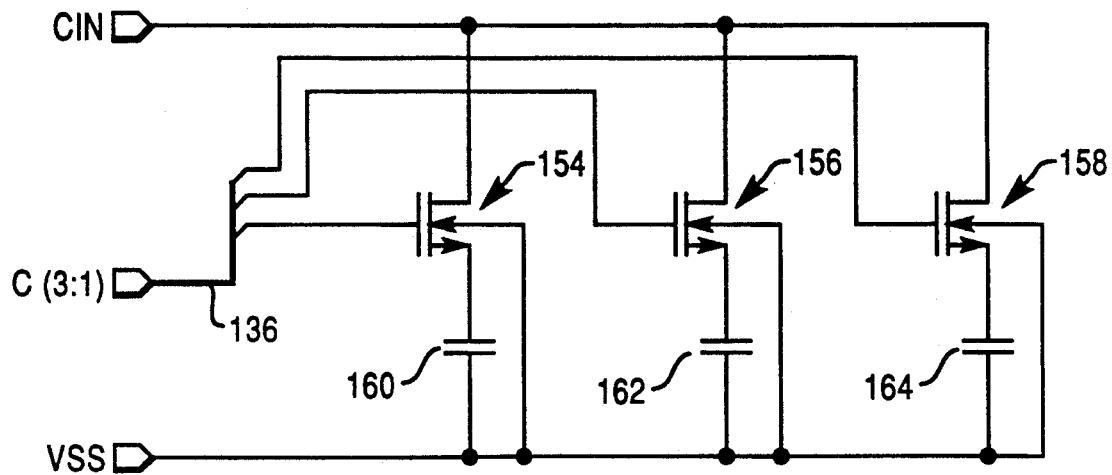
FIG. 5 is a detailed schematic diagram of the programmable capacitors shown in FIG. 3.

Referring to FIG. 5, there is shown a detailed schematic of the capacitor 130 of FIG. 3. The circuits within capacitors 130-136 are identical and accordingly only programmable capacitor 130 will be described.

Programmable capacitor 130 has a plurality of FET's 154, 156 and 158 each having a source, gate and drain terminal. The drain terminals of these FET's 154-158 are connected through line (CIN) to the output of inverter 116 and the input of inverter 110 (See FIG. 3). The gates of FET's 154-158 are each connected to programming line 136 which has a digital signal thereon which enables and disables FET's 154-158. The source terminals of FET's 154-158 are each connected through a respective capacitor 160, 162, 164 to terminal VSS. Each of capacitors 160-164 are selected to have a different value. Preferably the value of capacitor 160 is 0.06 pico Farads (pf), capacitor 162 is 0.04 pf, and capacitor 164 is 0.03 pf.

It is recognized that N-channel only transistors are used to reduce parasitic capacitance on the CIN line. It is noted that the capacitor acts on the oscillator circuit only when the output of inverter 116 is below about 3.5 volts due to the N-channel only analog transistors 154-158. It is also recognized that these programmable capacitors 130-136 improve tolerance to process variations of the inverters 110-116, and ring oscillator 46 at frequencies between 30-100 Mhz. It is also recognized that capacitors 130-136 can be fabricated with better control of parasitic capacitance if FET's 154-158 and capacitors 160-164 are used in place of MOS transistors.

Figure 6:
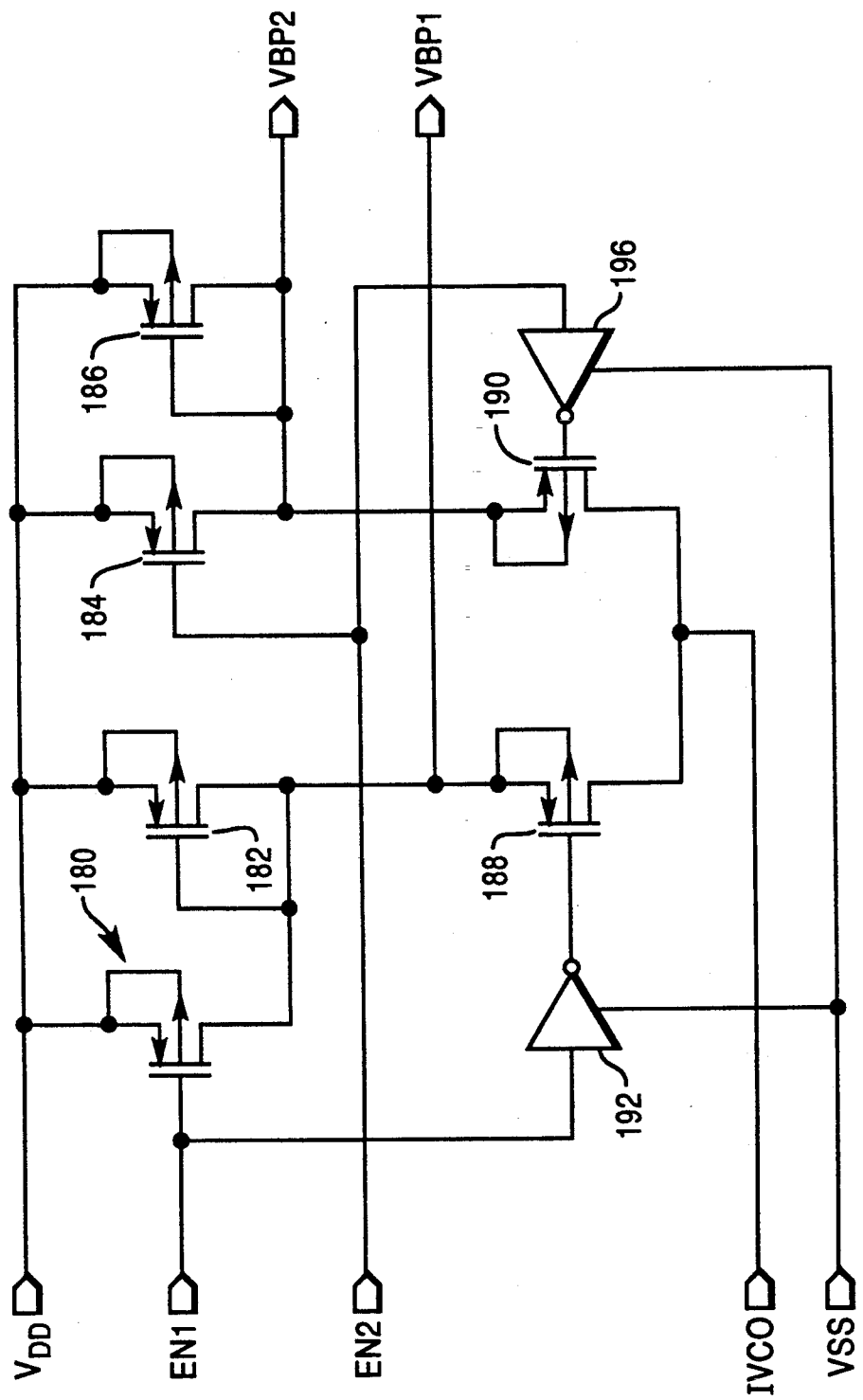
FIG. 6 is a detailed schematic diagram of a circuit for generating bias voltage to the seven stage oscillator shown in FIG. 1A.

Referring to FIG. 6, there is shown one form of the voltage bias circuit generator 50 which biases ring oscillators 44 and 46 to set the delay of each stage and thus the oscillation frequency. Generator 50 has a plurality of FET's 180-190 each having a source, gate and drain terminal. The source terminals of FET's 180-186 are connected to the VDD line. The drain terminals of FET's 180 and 182 feed the VBP1 signal to oscillator 44 (FIG. 1B). The drain terminals of FET's 184-186 feed the VBP2 signal to oscillator 46 (FIG. 1B). The EN1 signal is fed to transistor 180 and the input terminal of inverter 192. The EN1 signal controls transistor 180 and is inverted by inverter 192 for controlling transistor 188. The EN2 signal controls transistor 184 and is fed through inverter 196 for controlling transistor 190. Reference voltage VSS is coupled to inverters 192 and 196.

Figure 7:
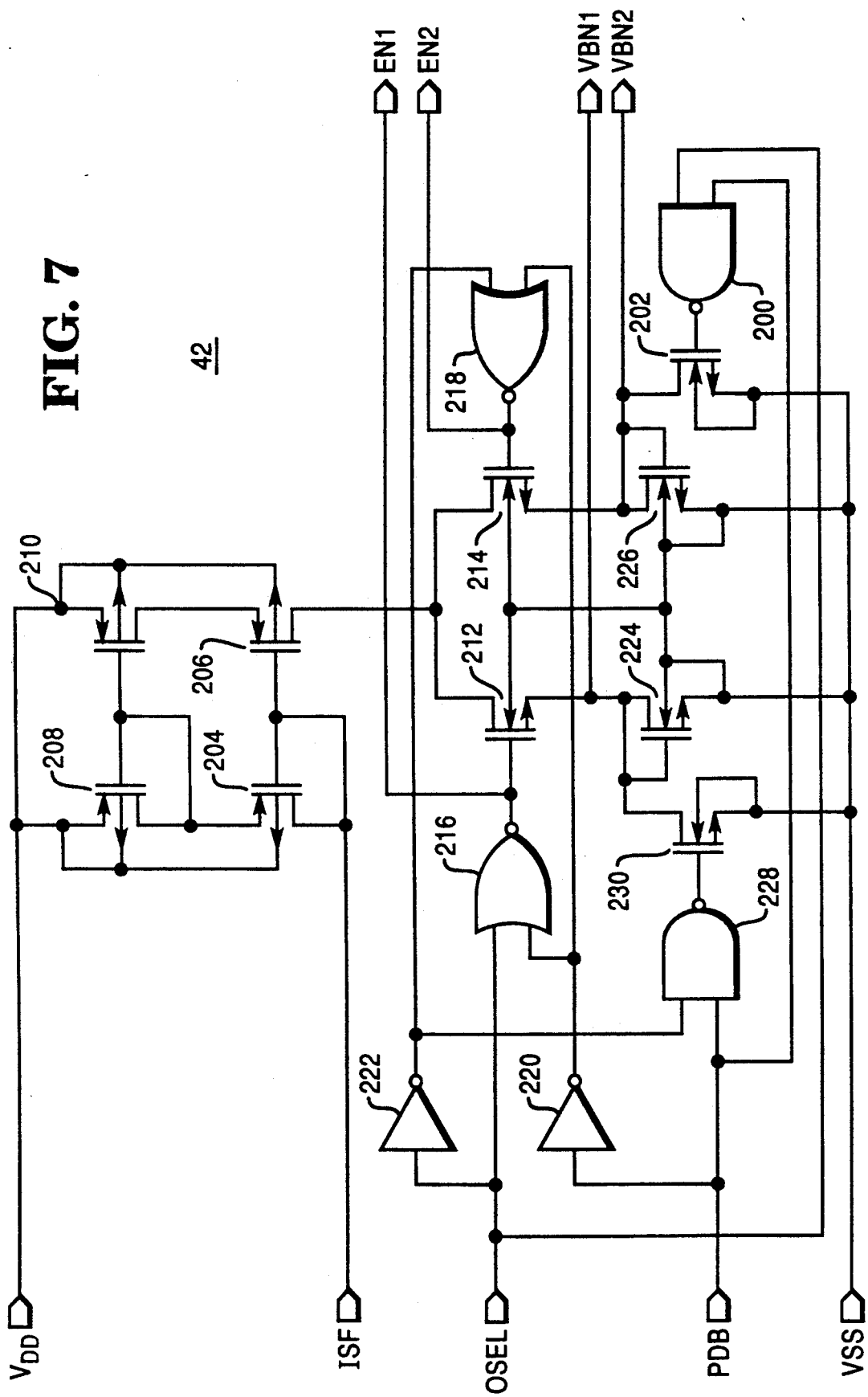
FIG. 7 is a detailed schematic diagram of a circuit for generating an additional bias for the seven stage ring oscillator shown in FIG. 1A.

Referring to FIG. 7, there is shown a bias current generator 42 which generates a voltage having a constant value that is used to bias the source follower buffers in oscillators 44-46. Bias current generator 42 biases the source follower buffers in FIGS. 2 and 3 enables either oscillator 44 or 46. Generator 42 is powered from VDD and VSS. The OSEL signal and digital PDB signals are fed to a NAND gate 200 having an output which drives transistor 202. The ISF signal is fed to the gate and drain terminals of transistor 204 as well as the gate of transistor 206. The source terminals of transistors 204 and 206 bias transistors 208 and 210 respectively. The drain of transistor 206 is connected to the drains of transistors 212 and 214.

Transistors 212 and 214 are respectively driven by the outputs of NOR gates 216 and 218. The output terminals of dual input NOR gates 216 and 218 generate EN1 and EN2 signals respectively that are fed to oscillators 44 and 46 as well as bias voltage generator 50. One input terminal of dual input NOR gate 216 is fed OSEL signal. OSEL signal is inverted with inverter 222 and fed to one input of NOR gate 218. The other inputs of NOR gates 216 and 218 are fed the inverted PDB signal from inverter 220. The sources of transistors 224 and 226 are connected to VSS.

The OSEL signal is connected through inverter 222 and NANDed with the PDB signal with NAND gate 228. The output of NAND gate 228 biases transistor 230. The drain terminal of transistor 230 generates a VBN1 signal that biases transistor 224 and is fed to oscillator 44. The drain terminal of transistor 202 with the source terminal of transistor 214 generates a VBN2 signal which biases transistor 226 and is fed to oscillator 46. The source of transistor 230 is connected to VSS.

Figure 8:
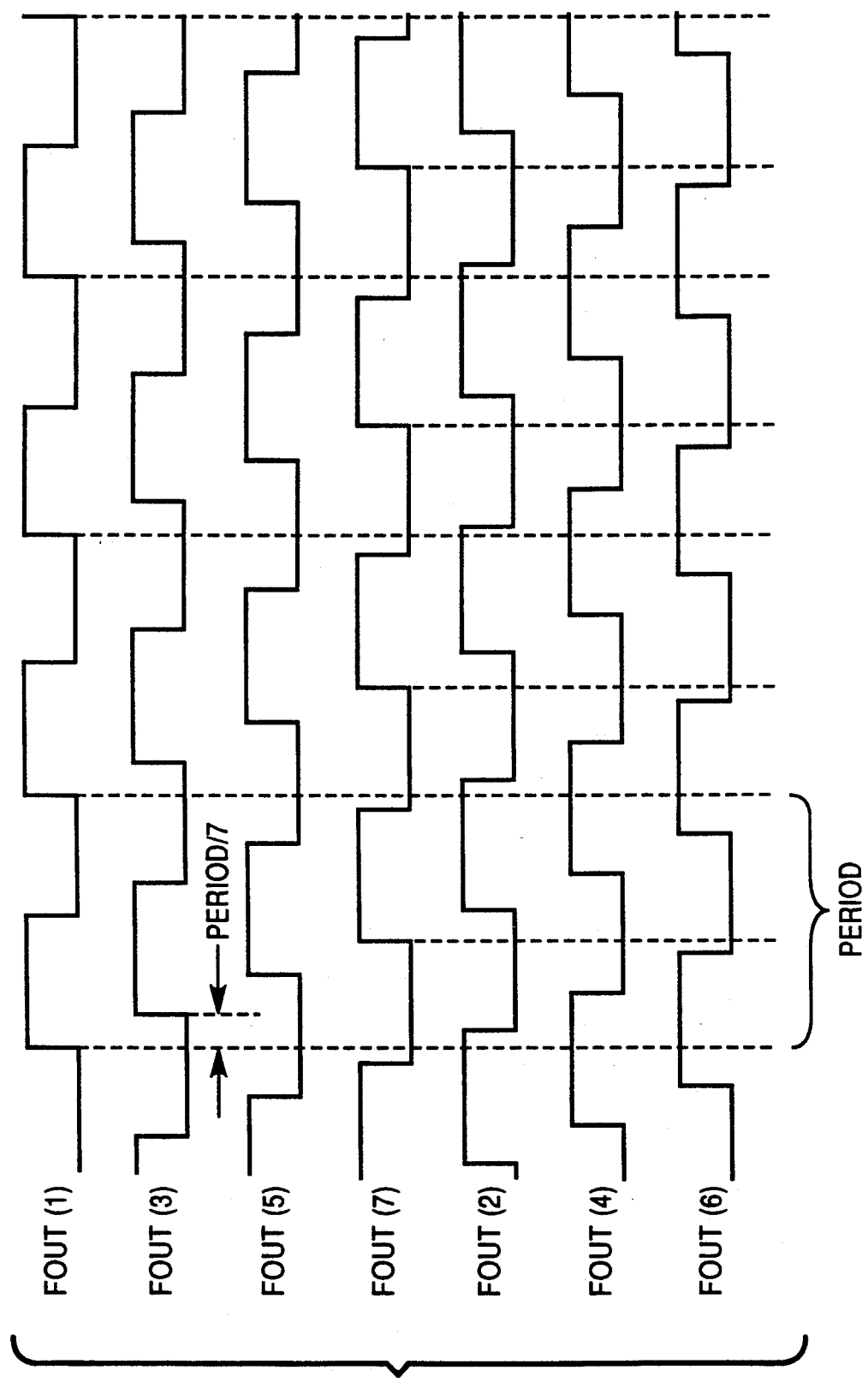
FIG. 8 is a timing diagram of exemplary frequency outputs (FOUTS) of the oscillating circuit in FIG. 1B.

Exemplary outputs shown in FIG. 8. The output of each alternate stage is delayed by the period of the waveforms divided by seven (number of stages). It is recognized by the inventor that a precision delay element is formed by a pair of inverters.

This concludes the description of the preferred embodiments. A reading by those skilled in the art will bring to mind various changes without departing from the spirit and scope of the invention. It is intended, however, that the invention only be limited by the following appended claims.

What is claimed is:

1. An electrically controlled oscillator circuit comprising:

a ring oscillator having a plurality of stages, each stage having an input terminal and an output terminal, and producing a signal having a preselected frequency;

a plurality of capacitor means having electrically programmable capacitance values, each of said capacitor means being electrically coupled to respective ones of said output terminals of said plurality of oscillator stages; and means for selecting the programmable values of said plurality of capacitor means for setting said output signal frequencies of said stages.

2. The circuit as recited in claim 1 wherein said selecting means comprises:

a programmable current source connected to each of said plurality of stages; and means within each of said plurality of stages for varying said output signal frequency in accordance with the magnitude of current from said current source.

3. The circuit as recited in claim 2 wherein said current source is responsive to an applied voltage for establishing the magnitude of current, said circuit including means for developing an applied voltage for programming the current source.

4. The circuit as recited in claim 1 further comprising a plurality of source follower buffers having input terminals connected to respective ones of said output terminals of said plurality of stages.

5. The circuit as recited in claim 4 wherein each of said source follower buffers comprise a field effect transistor having a gate terminal connected to a corresponding output terminal of each of said plurality of stages.

6. The circuit as recited in claim 1 wherein each said capacitor means includes a plurality of transistors each having a source, a gate and a drain terminal, one of a plurality of capacitors being serially connected to each source terminal, the drain terminals of said transistors being connected to said output terminal and the gate terminals of said transistors being connected to a programming line.

7. The circuit as recited in claim 6 wherein at least one of said capacitors connected to the source terminal on one of the plurality of transistors has a capacitance value different from the capacitance value of another capacitor connected to the source terminal of another of the plurality of transistors.

8. An electrically programmable oscillator circuit comprising:

a ring oscillator having a plurality of inverters with an input and an output terminal, each inverter being operative to provide a preselected frequency, said inverters, being connected in a series circuit arrangement with an output terminal of each inverter being coupled to an input terminal of a next inverter in the series;

means for providing a variable bias current to said plurality of inverters such that the preselected frequency of each inverter varies within a predetermined range as a function of the bias current;

means for providing a plurality of different frequency programming signals; and a plurality of variable capacitance stages respectively connected to the output terminals of said inverters, said inverters being responsive to the different frequency programming signals for selecting a capacitance value to set the predetermined range in which the frequency of each inverter varies.

9. The circuit as recited in claim 8 wherein said capacitance stages include at least one transistor having a drain terminal connected to the output terminal, a gate terminal connected to said signal providing means, and a source terminal connected through a capacitor to ground.

10. The circuit as recited in claim 8 wherein each of said capacitance stages includes a plurality of transistors having a drain terminal connected to said output terminal of one of said plurality of inverters, a gate terminal connected to said signal providing means, and a source terminal connected through a capacitor to ground, and wherein at least one of said capacitors connected to one of said plurality of transistors has a value different from another of said capacitors connected to another of said plurality of transistors.

11. An electrically controlled oscillating circuit comprising:

a ring oscillator having a plurality of inverting stages, each of said stages having an input terminal and an output terminal, wherein said input terminals being electrically connected to a respective output terminal of another of said stages for establishing a series circuit arrangement of said stages;

means for providing a varying voltage level;

a plurality of current sources respectively connected to said providing means and respectively connected to said stages, said current sources having means for feeding current to said stages and for varying the magnitude of current to said stages in accordance with the level of said varying voltage, said inverting stages being responsive to said magnitude of current for setting an oscillation frequency of said ring oscillator; and a second-ring oscillator having a plurality of stages with an input terminal and an output terminal, each stage providing a preselected oscillation frequency signal;

a plurality of capacitors having electrically programmable capacitance values, said capacitors being electrically coupled to respective ones of the output terminals of the plurality of stages of said second ring oscillator, the programmable values of said plurality of capacitors controlling said preselected oscillation frequency;

means connected to said first ring oscillator and said second ring oscillator for providing a signal for selecting either the first ring oscillator or the second ring oscillator; and means responsive to said signal for enabling the output of the selected ring oscillator and for disabling the output of the other of the ring oscillators.

12. A programmable ring oscillator comprising a plurality of serially coupled oscillator stages, each of said stages including a plurality of capacitors selectively connectable in circuit with said stages for establishing a preselected oscillation frequency band for said oscillator, and each of said stages further including a controllable current source for establishing a selected current for setting a selected oscillation frequency within said frequency band.

13. An oscillator system including a first and a second ring oscillator as recited in claim 12 said first oscillator being programmable to oscillate within a first range of frequencies and said second oscillator being programmable to oscillate within a second range of frequencies, the system including means for enabling only one of said first and second oscillators at any time.

* * * * *